(12) United States Patent
Fukuyama et al.

(10) Patent No.: US 6,831,406 B1
(45) Date of Patent: Dec. 14, 2004

(54) ELECTROLUMINESCENT DEVICE HAVING A VERY THIN EMISSION LAYER

(75) Inventors: Masao Fukuyama, Tokyo (JP); Mutsumi Suzuki, Yokohama (JP); Yuji Kudo, Kawasaki (JP); Yoshikazu Hori, Kawasaki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/577,137

(22) Filed: May 24, 2000

(30) Foreign Application Priority Data

May 25, 1999 (JP) ............................................ 11-144497

(51) Int. Cl.$^7$ ............................................... H05B 33/04
(52) U.S. Cl. ........................ 313/504; 313/503; 313/506
(58) Field of Search .................................. 313/503, 504, 313/506; 428/690, 917; 315/169.3

(56) References Cited

U.S. PATENT DOCUMENTS 6,368,730 B1 * 4/2002 Kishimoto et al. ....... 313/504 X
6,566,807 B1 * 5/2003 Fujita et al. ................ 313/506

OTHER PUBLICATIONS

"Organic electroluminescent diodes", C.W. Tang et al., Appl. Phys. Lett., vol. 51, No. 12, Sep. 21, 1987, pp. 913–915.
"Electroluminescence of doped organic thin films", C.W. Tang, et al., J. Appl. Phys., vol. 65, No. 9, May 1, 1989, pp. 3610–3616.
"Progress in organic multilayer electroluminescent devices" by Saito et al., Electroluminescent Materials, Devcies, and Large–Screen Displays, San Jose, CA, USA. Feb. 1–2, 1993, vol. 1910, pp. 212–221.
"Organic electroluminescent device with cyanine dye Langmuir–Blodgett film as an emitter" by Era et al., Thin Solid Films, Elesevier–Sequoia S.A. Lausanne, CH, vol. 210/211, No. 1/2 part 2, Apr. 30, 1992, pp. 468–470.
"Confinement of charge carriers and molecular excitons within 5–nm–thick emitter layer in organic electroluminescent devices with a double heterostructure" by Adachi et al., Applied Physics Letters, American Institute of Physics., New York, U.S., vol. 57, No. 6, Aug. 6, 1990, pp. 531–533.
"Effect of well number on organic multiple–quantum–well electroluminescent device characteristics" by Huang et al., Applied Physics Letters, American Institute of Physics., New York, U.S., vol. 73, No. 23, Dec. 7, 1998, pp. 3348–3350.
"Electroluminescence in Organic Films with Three–Layer Structure" by Adachi et al., Japanese Journal of Applied Physics, Publication Office Japanese Journal of Applied Physics. Tokyo, JP, vol. 27, No. 2, Feb. 1988, pp. L269–L271.
"Emission Mechanism in Rubrena–Doped Molecular Organic Light–Emitting Diodes: Direct Carrier Recombination at Luminescent Centers" by Murata et al., IEEE Journal of Selected Topics in Quantum Electronics, IEEE Service Center, U.S., vol. 4, No. 1, 1998, pp. 119–124.

* cited by examiner

*Primary Examiner*—Ashok Patel
(74) *Attorney, Agent, or Firm*—McDermott, Will & Emery

(57) ABSTRACT

An organic electroluminescent device comprises a pair of electrodes, and a layer structure provided between the pair of electrodes and including a charge transport layer capable of transporting electrons or holes and an emission layer comprising a major proportion of an organic material capable of emitting light on application of a voltage thereto via the pair of electrodes. The organic material undergoes concentration quenching and the emission layer has a thickness of 4 nm or below. The emission layer may be made of an electroluminescent organic material, which has a fluorescent lifetime shorter than an organic material present in the charge transport layer.

39 Claims, 4 Drawing Sheets

ELECTROLUMINESCENT DEVICE HAVING A VERY THIN EMISSION LAYER

BACKGROUND OF THE INVENTION

1. Field of the Invention

This invention relates to a light emission device, which is utilizable in various fields as a variety of display devices, and more particularly, to an organic electroluminescent device, which works at a low drive voltage and is high brightness and excellent in stability.

2. Description of the Prior Art

Electroluminescent devices are self-luminescent in nature, and are thus brighter than light crystal devices, enabling a clear display. Accordingly, research workers have long studied such devices. Existing electroluminescent devices, which arrive at a level in practical use, are those which make use of inorganic materials such as ZnS. However, such inorganic electroluminescent devices are not in wide use because their drive voltage for emission is as high as 200 V or over.

On the contrary, organic electroluminescent devices, which utilize light-emitting organic materials, have still been far from the practical level. In 1987, C. W. Tang et al of Eastman Kodak Co., (Applied Physics Letters, Vol. 51, p. 918, 1987) developed a builtup structure device, with a drastic advance in characteristic performance. More particularly, they succeeded in light emission by use of a builtup structure which includes a phosphor or fluorescent body having the stable structure of a deposition film and capable of transporting electrons, and an organic film capable of transporting holes. The carriers from both are injected into the phosphor body. This organic electroluminescent device has a much improved luminous efficiency, and is capable of emission at 1000 cd/m$^2$ or more on application of a voltage of 10V or below.

Furthermore, as set out in Journal of Applied Physics, Vol. 65, p. 3610, 1989), C. W. Tang et al of Eastman Kodak Co., proposed an emission layer using a guest/host system, making it possible to further improve a luminous efficiency and use a diversity of luminescent materials. At present, most of the organic electroluminescent devices having a high luminous efficiency employ an electroluminescent layer based on the guest/host system.

However, in order to obtain a device whose luminous efficiency is improved by use of the guest/host system, it is necessary that a light-emitting material serving as a guest material be doped at a low concentration of approximately 1 mole % in a host material. The light emission layer of the organic electroluminescent device is approximately several tens of nanometers in thickness. The emission layer is usually formed by vacuum deposition. Accordingly, a difficulty is involved in the uniform formation of a thin film emission layer, doped at such a low concentration, on a substrate with a great area. This presents a serious problem on the application of the device using the gust/host system.

In addition, when a light-emitting material used as a guest material is employed as an emission layer in a usual manner, it has been difficult to obtain an organic electroluminescent device with a good luminous efficiency.

SUMMARY OF THE INVENTION

It is accordingly an object of the invention to provide an organic electroluminescent device which is high in luminous efficiency and is capable of realizing light emission in different colors and whose brightness lowers only slightly over the life of the device.

It is another object of the invention to provide an organic electroluminescent device which has a very thin emission layer or islands made of an organic material whereby light emission is achieved by use of the organic material alone or in admixture with other material in high concentration, which has never been experienced in prior art.

It is a further object of the invention to provide an organic electroluminescent device which has several emission layers as separate layers in the device whereby a higher luminous efficiency is realized.

It is a still further object of the invention to provide an organic electroluminescent device, which is able to emit white light.

Broadly, the invention provides an organic electroluminescent device, which comprises a pair of electrodes, and a layer structure provided between the pair of electrodes and including a charge transport layer capable of transporting electrons or holes and an electroluminescent or emission layer comprising at least 50 wt % of an organic material capable of emitting light on application of a voltage thereto via the pair of electrodes, wherein the organic material undergoes "concentration quenching and the emission layer has a thickness of 4 nm or below. The term "concentration quenching" used herein is intended to mean the phenomenon that when the concentration of the material increases, emission ceases. In the practice of the invention, there are used organic compounds, which allow concentration quenching to occur at a concentration of 10 mole % or over in a layer composition. The concentration may, more or less, vary depending on the type of luminescent material.

Preferably, the emission layer consists essentially of the organic material.

Alternatively, the organic material used in the invention may be one, which may or may not undergo any "concentration quenching", but has a fluorescence lifetime shorter than a constituent organic material for the charge transport layer. In this case, the emission layer should also have a thickness of 4 nm or below. More particularly, there is also provided, according to another embodiment of the invention, an organic electroluminescent device, which comprises a pair of electrodes, and a layer structure provided between the pair of electrodes and including a charge transport layer capable of transporting electrons or holes and an emission layer consisting essentially of an organic material capable of emitting light on application of a voltage thereto via the pair of electrodes, wherein the organic material has a fluorescent lifetime shorter than that of an organic material present in the charge transport layer.

EMBODIMENTS OF THE INVENTION

Figure 1:
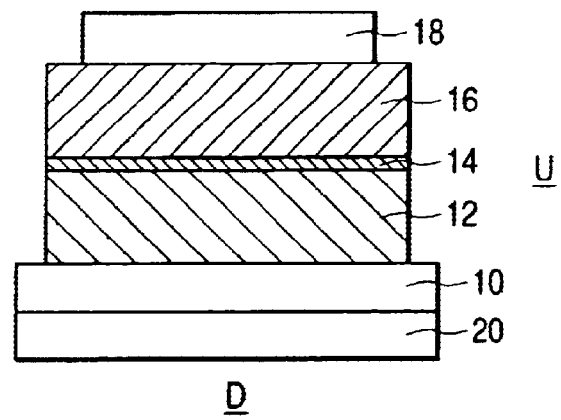
FIG. 1 is a sectional view showing an organic electroluminescent device according to a first embodiment of the invention.

Basically, the electroluminescent device of the invention should comprise a pair of electrodes, and a layer structure provided between the pair of electrodes and including a charge transport layer capable of transporting electrons or holes and a electroluminescent or emission layer comprising a major proportion of an organic material capable of emitting light on application of a voltage thereto via the pair of electrodes. The organic material should undergo concentration quenching and the emission layer should have a thickness of 4 nm or below. Alternatively, the organic material may be of the type whose fluorescent lifetime is shorter than a material contained in the charge transport layer.

More particularly, the invention is based on the finding that when an electroluminescent organic material, which is optically quenched at a high concentration of 10 mole % or over in an emission layer containing the organic material, is formed as a thin layer of 4 nm or below, efficient light emission takes place. Moreover, the invention is also based on the finding that when an electroluminescent organic material whose fluorescent lifetime is shorter than a material in the charge transport layer is employed, efficient light emission likewise occurs.

The basic layer arrangement of the device according to the invention is first described with reference to the accompanying drawings, and particularly, to FIG. 1. In the figures, like reference numerals indicate like parts or members throughout the specification unless otherwise indicated.

In FIG. 1, there is shown an organic electroluminescent device D which includes an electroluminescent unit U. The unit U is depicted as having an anode 10, a hole transport layer 12, an emission layer 14, an electron transport layer 16, and a cathode 18 arranged in this order, and this order may be reversed. In the practice of the invention, the unit U should have, at least, the electrodes 10, 18 sandwiching therebetween the emission layer 14 and a charge transport layer capable of transporting electrons or holes, i.e. either the hole transport layer 12 or the electron transport layer 16. As a matter of course, it is preferred to form the emission layer 14 between the hole transport layer 12 and the electron transport layer 16, as is particularly shown in FIG. 1, because of the well balanced injection of holes and electrons into the emission layer 12. If necessary, the unit U may be formed on a substrate 18 in a usual manner in this and other embodiments.

Fabrication the device D is described.

The anode 10 is first formed usually on an optically transparent, insulating substrate made, for example, of glass or an optically transparent plastic material such as polyesters, polyethylene terephthalate, polyester sulfones or the like. Preferably, the anode 10 is made, for example, of a conductive transparent material, such as indium tin oxide (ITO), zinc aluminium oxide, $Cd_2SnO_4$ or the like, to provide an optically transparent electrode, or a conductive semi-transparent material, such as gold or platinum, to provide an optically semi-transparent electrode. A film of the above-mentioned material is formed on the substrate by vacuum deposition or sputtering, thereby forming an optically transparent or semi-transparent film as the anode 10. This anode 10 is usually formed in a thickness of 0.02 to 1 µm.

Subsequently, the hole transport layer 12 is formed on the anode 10 when this is used as a charge transport layer. The hole transport material used preferably has good stability against oxidation and high mobility of holes, is capable of forming a pinhole-free thin film, and is transparent with respect to the fluorescence emitted from the emission layer 14. Typical and preferred materials, which meet the above requirements, triphenylamine derivatives such as 1,1-bis(4-di-p-tolylaminophenyl)cyclohexane, N,N'-diphenyl-N,N'-bis(3-methylphenyl)-1,1'-biphenyl-4,4'-diamine, N,N'-diphenyl-N,N'-bis(p-tolyl)-1,1'-biphenyl-4,4'-diamine, N,N,N',N'-tetra(p-tolyl)-4,4'-diaminobiphenyl, N,N'-bis(4'-diphenylamino)-4-(biphenylyl)-aniline, N,N'-bis(4'-diphenylamino-4-biphenylyl)-N,N'-diphenylbenzidine, and the like. Of course, other types of materials, which are ordinarily used for this purpose, may also be used including phthalocyanine derivatives, hydrazone derivatives, stilbene derivatives, oxazole derivatives, triazole derivatives, imidazole derivatives, and polymers having hole transportability such as polyvinyl carbazole, polyvinylparaphenylenevinylidene, polythiophene derivatives such as polyethylene dioxythiophene (PEDOP), and the like.

The hole transport layer 12 is formed on the anode 10 by vacuum deposition by resistance heating. To this end, the above-mentioned materials may be formed as a single layer or a built-up layer of two or more films, if required.

The emission layer 14 is then formed on the hole transport layer 12, if the layer 12 is present as the charge transport layer. This layer 14 is made of a composition comprising a major proportion of a specific type of organic material in a specified thickness, or an organic material whose fluorescent lifetime is shorter than a material used as the charge transfer layer 12 or 16. The type of composition or organic material and the layer thickness have to be defined in a specific way, respectively. Accordingly, details of the type and thickness are discussed hereinafter.

Thereafter, the electron transport layer 16 is formed on the layer 14, if the layer 16 is present, in place of the layer 12, as the charge transport layer. If present, the electron transport layer 16 should be made of a material having great mobility of electrons and capable of forming a pinhole-free thin film. The materials meeting this requirement include, for example, benzoquinolinol complexes such as bis(10-benzo[h]quinolinol)beryllium, oxazole complexes such as 2(4-biphenylyl)-5-(4-tert-butylphenyl)-1,3,4-oxadiazole, and the like.

This layer 16 can also be formed by vacuum deposition by resistance heating. The electron transport layer 16 is preferably formed in a thickness of 0.005 to 1 µm.

Thereafter, the cathode 18 is formed on the electron transport layer 16, if this layer 16 is present.

The cathode 18 charges electrons into the emission layer 14 through the electron transport layer 16, if present, and should have good environmental stability. The metals or alloys meeting the above requirement include, for example, metals such as Al, Mg, In, Sn, Zn, Ag and the like, alloys such as Al and Li alloys, Mg and Ag alloys, Ag and Li alloys and the like.

The cathode 18 is formed on the thus formed layer structure by resistance heating when using a metal. On the other hand, when an alloy is used, the cathode is formed according to a co-deposition method wherein two types of metals are discharged and deposited from separate evaporation sources by resistance heating under a reduced pressure in the order of magnitude of $10^{-5}$ Torr. or below. The atomic ratio between the metals in the alloy can be determined by controlling the deposition rates of the respective metals. The thickness of the deposited film is determined by monitoring with a thickness gage using a crystal oscillator, and is usually in the range of 0.05 to 1 $\mu$m. As a matter of course, the alloy, which has been prepared at a predetermined atomic ratio, may be used for this purpose. Moreover, the cathode may be formed not only by resistance heating, but also by an electron beam deposition technique or by sputtering.

In this way, the electroluminescent unit E, which is composed, at least, of the hole or electron transport layer 12 or 16 and the emission layer 14 sandwiched between a pair of electrodes 10, 18, i.e. the anode and the cathode, can be formed on the substrate 20.

Usually, the emission layer 14 is so arranged as to emit light on application of a voltage of 3 V or over thereto.

The arrangement of the electroluminescent unit U per se is known in the art, and the present invention is characterized in that the emission layer 14 is made of a composition, which comprises at least 50 wt % of an organic material undergoing an optically quenching phenomenon when its concentration in the emission layer 14 is increased, and the layer thickness is within a range of 4 nm or below. Alternatively, the emission layer may be made of an organic material whose fluorescent lifetime is shorter than an organic material present in the charge transport layer 12 or 16 and has such a thickness of 4 nm or below.

Examples of the first-mentioned type of organic material include various types of fluorescent organic compounds such as laser dyes. Useful compounds include quinacridone derivatives, coumarin derivatives, merocyanin derivatives, oxazole derivatives, thiazole derivatives, styryl derivatives, flavone derivatives, quinoline derivatives, acridine derivatives, condensed polycyclic compounds and the like. Specific examples include N,N'-dimethylquinacridone (hereinafter referred to simply as DMQ), N,N'-diphenylquinacridone, 3-(2'-benzothiazolyl)-7-diethylaminocoumarin (hereinafter referred to simply as coumarin 6), 4-dicycnomethylene-2-methyl-6-(p-dimethylaminostyryl)-4H-pyran (hereinafter referred to simply as DCM), rubrene, diphenyltetracene, perylene, and the like. These may be used singly or in combination.

It is known that these compounds are fluorescent in nature and are usually employed in the form of a dispersion in a polymer, having its concentration of up to several mole % because of their quenching at a higher concentration.

We have found that when such a compound as indicated above is formed as a layer having thickness of 4 nm or below, electroluminescent emission takes place efficiently as will be appreciated from experimental data in examples appearing hereinafter. The emission layer should be made of a composition comprising at least 50 wt % of the fluorescent compound mentioned above with the balance being an inorganic compound such as SiO, GeO, NgO, MgF and the like. For the formation of the layer made of the composition, separate targets including the fluorescent organic compound and the inorganic compound are vapor deposited at predetermined deposition rates, respectively, to form the layer having a desired ratio between both types of compounds.

Preferably, the composition consists essentially of the organic compound alone as mentioned above.

Figure 2:
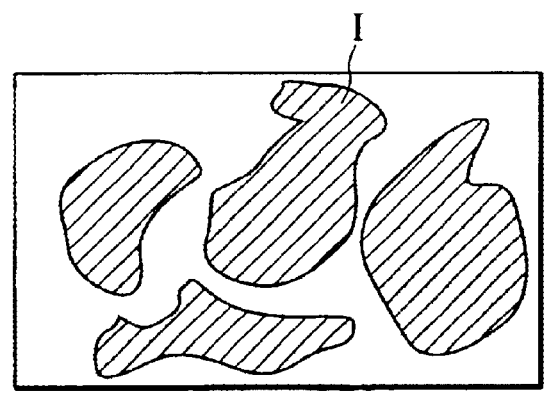
FIG. 2 is a schematic view showing an electroluminescent layer in the form of islands.

The layer 14 may be formed continuously throughout the layer over a lower layer. Alternatively, the layer 14 may be formed in the form of islands I as is particularly shown in FIG. 2. Such islands may be readily formed by vacuum deposition through a mask having an island-shaped pattern. In practice, when the layer 14 is formed in a thickness of 1 nm or below, a continuous film may not be formed but regions having no film formed thereon appear sporadically on a lower layer on which a compound for the layer 14 is to be deposited. Such a layer including the sporadical regions where no film is formed is usable of an emission layer permitting efficient electroluminescent emission.

The fluorescent organic compounds, used singly or in combination with an inorganic compound and showing the concentration quenching phenomenon, have been described for use as the emission layer 14. In the practice of the invention, the emission layer may be made of a fluorescent organic compound in combination with an organic material present in the charge transport layer 12 or 16 provided that the fluorescent lifetime of the fluorescent organic compound in the emission layer is shorter than the material in the charge transport layer 12 or 16. In this arrangement, the energy of excitons generated by re-combination of electrons and holes near the organic interface region can be more efficiently transported to the material in the emission layer 14, enabling one to obtain electroluminescent emission in a very high efficiency. The term "fluorescent lifetime" used herein means a time before the fluorescent intensity is reduced to 1/e of an initial intensity wherein e indicates an exponent. This lifetime is determined by measurement with a general-purpose fluorescent lifetime measuring apparatus.

A typical example of the combination includes a combination of 4-dicyanomethylene-2-methyl-6-(p-dimethylaminostyryl)-4H-pyran used in the emission layer and tris(8-quinolinol)aluminium (hereinafter referred to simply as Alq). The fluorescent lifetime of DCM is 2 to 3 nanoseconds and that of Alq is about 12 nseconds. In this case, the charge transport layer is an electron transport layer. If the emission layer is arranged to be sandwiched between the charge transport layer and the hole transport layer, it is sufficient that the lifetime of an organic compound in the emission layer is shorter than one of organic compounds in the electron and hole transport layers.

Other combinations include Coumarin 6 with a fluorescent lifetime of 1 nanosecond/Alq with a fluorescent lifetime of 12 nanoseconds, rubrene with a fluorescent lifetime of 4 nanoseconds/Alq with a fluorescent lifetime of 12 nanoseconds, and the like.

The two types of fluorescent organic materials for use as the emission layer are described. In both types, the fluorescent lifetime should preferably be 10 nanoseocnds or below. These compounds allow efficient transport of excitons generated through re-combination of electrons and holes in or near the organic interface region or regions.

Examples of an organic material having such a short fluorescent life include DCM, Coumarin 6, rubrene and the like as indicated above.

An electroluminescent device according to a second of the invention is described with reference to FIGS. 3 and 4.

In this embodiment, the electroluminescent unit U has the anode 10, the hole transport layer 12, the emission layer 14, the electron transport layer 16 and the cathode 18 formed in this order on the substrate 20, if necessary. In FIG. 3, the emission layer 14 is formed between electron transport sub-layers 16a and 16b. In the figure, X is a distance between the emission layer 14 and the hole transport layer 12 or a distance from the interface between the sub-layer 16b and the hole transport layer 12, which corresponds to the thickness of the sub-layer 16b. If X is 20 nm or below, electroluminescent emission is ensured.

Figure 3:
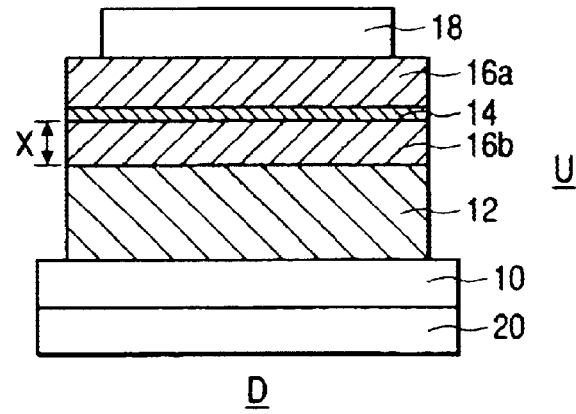
FIG. 3 is a sectional view showing an organic electroluminescent device according to a second embodiment of the invention.
Figure 4:
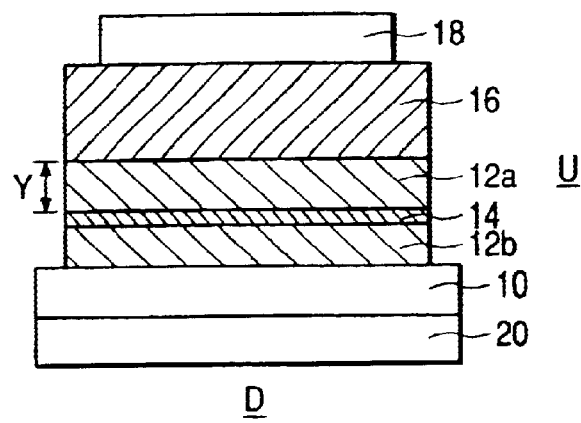
FIG. 4 a sectional view showing an organic electroluminescent device according to the second embodiment of the invention, but arranged in a different way.

In FIG. 4, the emission layer 14 is provided in the hole transport layer 12 or between the sub-layers 12a and 12b. In the figure, Y is a distance from the interface between the sub-layer 12b and the electron transport layer 16 to the layer 14. In contrast to the case of FIG. 3, the electroluminescent efficiency becomes poor when Y is larger than 2 nm. Accordingly, Y should be 2 nm or below.

In the embodiments of FIGS. 3 and 4, the energy of excitons, which are considered to exist in the vicinity of the interface, can be efficiently transported to the emission layer.

Of course, the emission layer may be provided at plural positions or sites, i.e. between the electron and hole transport layers, in the electron transport layer and in the hole transport layer whereby more efficient emission is realized. In all cases, the emission layer may be in the form of islands.

Figure 5:
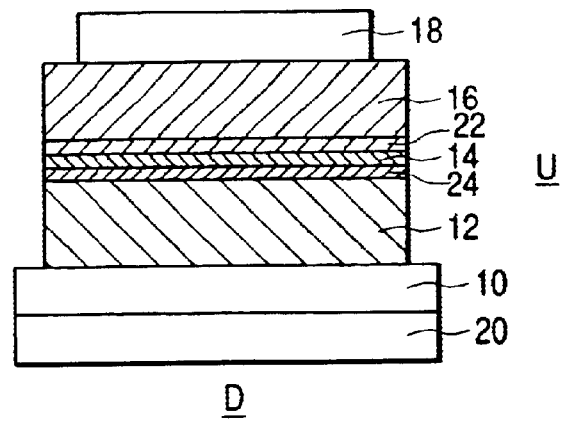
FIG. 5 is a sectional view showing an organic electroluminescent device according to a third embodiment of the invention.

FIG. 5 shows a third embodiment of the invention wherein the basic arrangement of the electroluminescent device is similar to that of FIG. 1 except that a hole block layer 22 and/or an electron block layer 24 is provided between the electron transport layer 16 and the emission layer 14 or between the hole transport layer 12 and the emission layer 14, respectively. When such a layer 22 and/or 24 is provided, the luminous efficiency is improved along with a good drive life. This is because the hole block layer or the electron block layer 22 is able to confine the region of re-combination of holes and electrons to near the emission layer.

The layer 22 or 24 is usually formed in a thickness of 0.1 to 10 nm by vapor deposition).

The layer 22 is made of those materials ordinarily used in organic electroluminescent devices. Examples of such materials include organic compounds such as metal complexes of triazole derivatives, 8-quinolinol derivatives and the like, and inorganic compounds such as alkali metal compounds, alkaline metal compounds, aluminium oxide and the like. Specific examples include 3-(4-biphenylyl)-4-phenylyl-5-t-butylphenylyl-1,2,4-trizole, tris(8-quinolinol)aluminium, LiF, Li$_2$O, MgF, CaF, SiO, GeO and the like.

The layer 24 may be made of ones ordinarily employed in the organic electroluminescent device, which include, for example, organic compounds such as aromatic amine compounds, and inorganic compounds such as alkali meal compounds, alkaline earth meal compounds, oxides, fluorides and the like. Specific examples include LiF, Li$_2$O, MgF, CaF, SiO, GeO and the like.

The materials such as LiF, a triazole derivative and the like may be used both as the electron and hole block layers. Both of the layers 22 and 24 should preferably be formed at the same time because a more prolonged drive life is attained.

Figure 6:
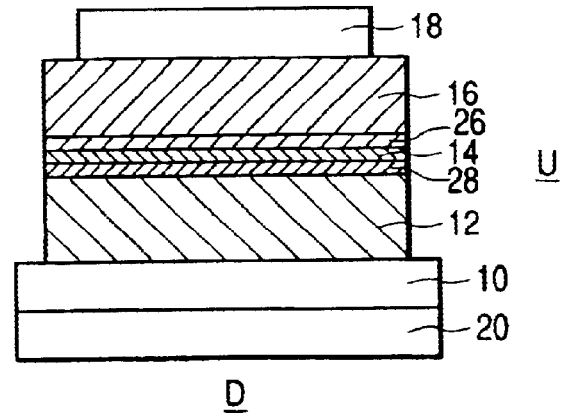
FIG. 6 is a sectional view showing an organic electroluminescent device according to a fourth embodiment of the invention.

FIG. 6 shows a fourth embodiment of the invention wherein a mixed layer 26 of an electron transport material and an electroluminescent material is provided between the electron transport layer 16 and the emission layer 14 and/or a mixed layer 28 of an hole transport material and electroluminescent material is provided between the hole transport layer 12 and the emission layer 14. The electroluminescent material, the electron transport material, and the hole transport material used in the mixed layer 26 and/or 28 are, respectively, those indicated hereinbefore. These layers may be formed in a thickness of 0.1 to 50 nm. The ratio between the electroluminescent material and the electron transport material or hole transport material is preferably in the range of 1:100 to 4:5 on the molar basis. The provision of these layers contributes to the stabilization of the interface with the emission layer, thus leading to improved emission stability.

Figure 7:
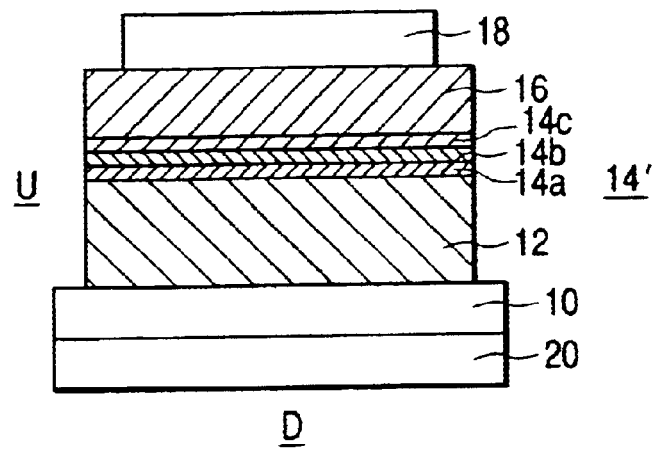
FIG. 7 is a sectional view showing an organic electroluminescent device according to a fifth embodiment of the invention.

FIG. 7 shows a fifth embodiment of the invention wherein emission sub-layers 14a, 14b and 14c are superposed as an emission layer 14' in place of the emission layer 14 in the first embodiment. The emission sub-layers 14a, 14b, 14c are provided between the hole transport layer 12 and the electron transport layer 16 as is particularly shown in FIG. 7. In this arrangement, if the sub-layer 14a is made of an electroluminescent material capable of red electroluminescent emission, e. g. DMC, the sub-layer 14b is made of a material capable of green electroluminescent emission, e. g. Coumarin 6, and the sub-layer 14c is made of a material capable of blue electroluminescent emission, e. g. tetraphenylbutadiene (TPB), white electroluminescent emission is realized. When the white electroluminescence is passed through an appropriate filter device, separate color emissions become possible. White emission may also be obtained by mixing of bluish green electroluminescent emission and orange electroluminescent emission. To this end, the emission layer 14' may have a double-layered structure.

The electroluminescent devices depicted in FIGS. 6 and 7, which have kinds of multi-layered structure, enable one to further improve a luminous efficiency because of the increase in emission region and to realize a variety of electroluminescent colors by mixing of a plurality of emission colors from the multi-layered structure.

Figure 8:
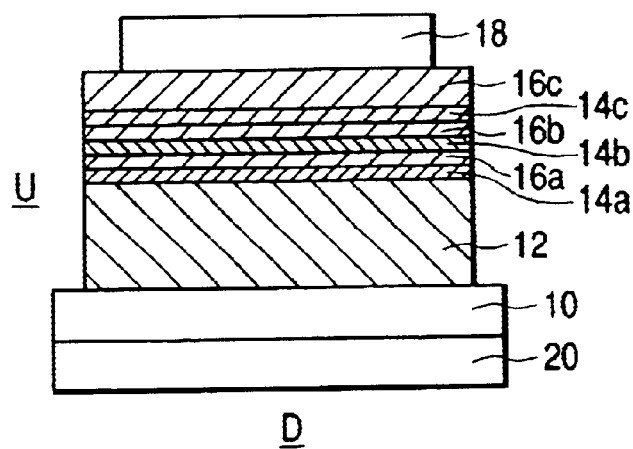
FIG. 8 is a sectional view showing an organic electroluminescent device according to a sixth embodiment of the invention.

In the above arrangement, the emission layers 14a, 14b, 14c are built up to provide a three-layered structure according to a sixth embodiment of the invention. As described with reference to FIG. 3, the emission layer may be formed in the electron transport layer at a distance of up 20 nm from the interface with the hole transport layer. In this sense, as shown in FIG. 8, emission sub-layers 14a, 14b, 14c may be formed between the electron transport layer 16 and the hole transport layer 12 and also inside the electron transport layer 16. In FIG. 8, two emission sub-layers 14b, 14c are formed in the electron transport layer 16. In this case, it is necessary to form the emission sub-Layer 14c at a distance of up to 20 nm from the interface with the hole transport layer 12.

Figure 9:
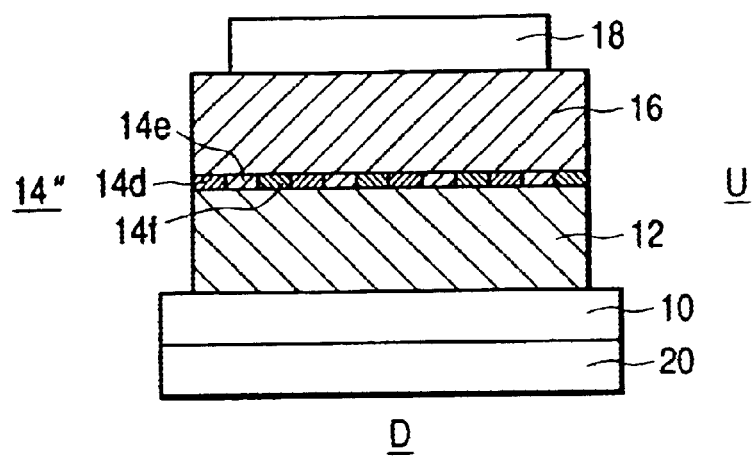
FIG. 9 is a sectional view showing an organic electroluminescent device according to a seventh embodiment of the invention.

FIG. 9 shows a seventh embodiment of the invention wherein the emission layer 14' is formed in a pattern having a number of emission regions 14d, 14e, 14f that are contiguously formed with each other. The regions 14d, 14e, 14f are arranged side by side on the layer 12, thereby forming a patterned emission layer 14'. If the regions 14d, 14e, 14f are, respectively, made of different types of electroluminescent materials, e.g. red, green and blue electroluminescent emission materials, white electroluminescent emission is possible.

Figure 10A:
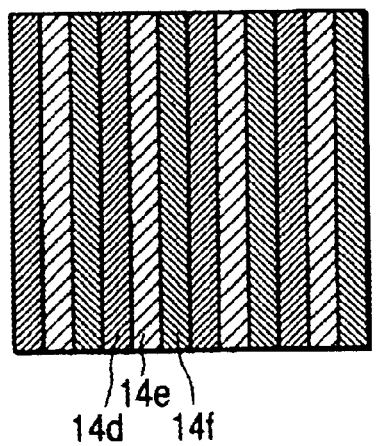
FIGS. 10a and 10b are, respectively, plan views showing emission layers of a striped pattern and a check pattern in the seventh embodiment.
Figure 10B:
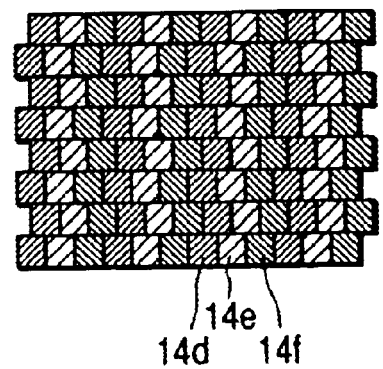

Examples of the pattern is more particularly shown in FIGS. 10a and 10b.

In FIG. 10a, the regions 14d, 14e, 14f are each in the form of a stripe as shown. The striped regions 14d, 14e, 14f are repeatedly formed along the width of the device as viewed in FIG. 10a. The width of each stripe is preferably in the range of 10 to 1000 μm.

In FIG. 10b, the emission layer 14' is formed in a block pattern having a number of emission regions 14d', 14e', 14f' each in the form, for example, of a square as shown.

In such an arrangement as shown in FIG. 10b, if the emission regions of the block pattern are, respectively, constituted of red, green and blue electroluminescent materials in a given order, white electroluminescent emission becomes more efficient.

In practice, when each region of FIG. 10b has a regular square, its size at one side is in the range of 10 to 1000 μm. Of course, the region may be rectangular in shape.

In FIGS. 9, 10a and 10b, three stripes or blocks corresponding to three electroluminescent materials are illustrated as one unit. Alternatively, these regions may be made of at least two electroluminescent materials alternately arranged throughout the layer.

The stripes and blocks made of desired materials may be readily formed by vacuum deposition through a an appropriate mask.

Moreover, the patterned layer 14 or 14' may be formed inside the electron transport layer or between the sub-layers of the electron transport layer.

The invention is more particularly described by way of examples. In the examples, N,N-bis[4'-(N,N'-diphenylamino)-4-biphenylyl]N,N'-diphenylbenzidine of the following formula (1) (hereinafter referred to simply as TPT) was used as a hole transport material, and tris(8-quinolinol)aluminium of the following formula (2) (hereinafter referred to simply as Alq) was used as an electron transport material. A device arrangement throughout the examples was an anode, a hole transport layer, an emission layer, an electron transport layer and a cathode built up in this order was used. This arrangement is not limitative. For instance, either a hole transport layer or an electron transport layer may be omitted, and the order of the layers may be reversed, i.e. it is possible that the cathode is first formed on a substrate and the anode is finally formed.

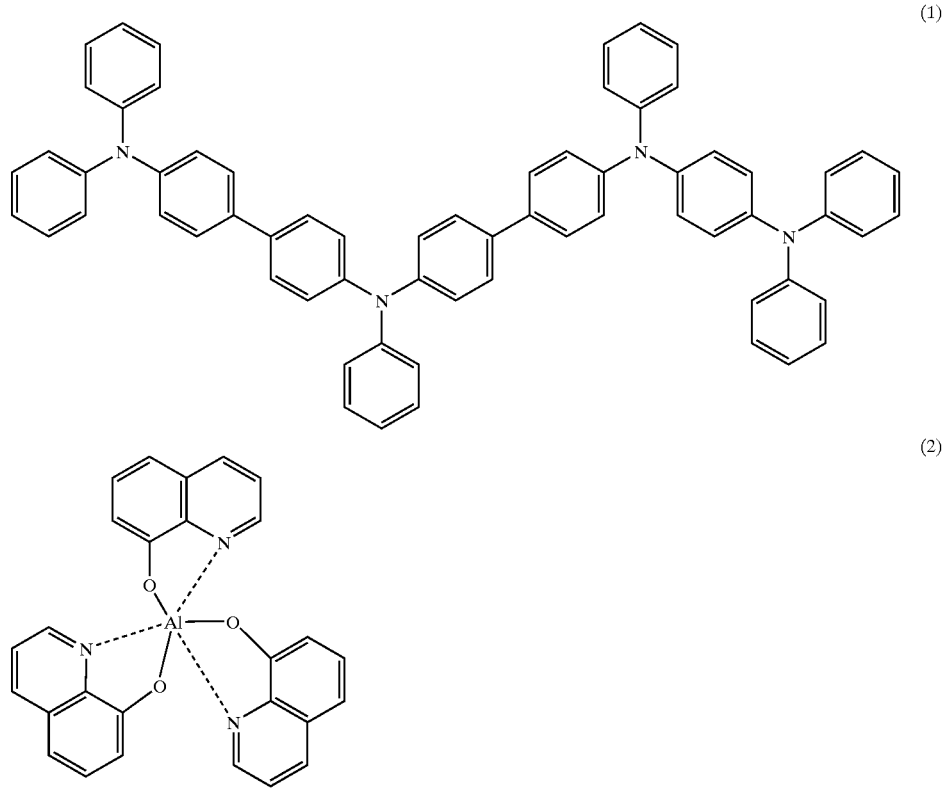

(1)

(2)

EXAMPLE 1

This example illustrates an electroluminescent device of the type shown in FIG. 1.

A sufficiently rinsed ITO electrode-formed glass substrate was first provided. The glass substrate, TPT, DCM of the following formula (3), Alq, aluminium and lithium were set in position of a vacuum deposition apparatus

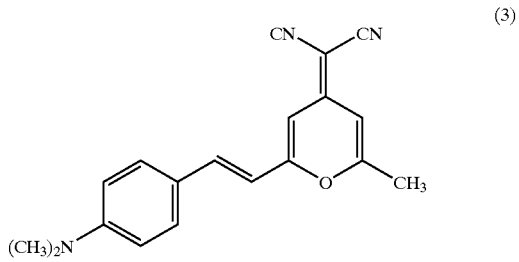

(3)

After evacuation to a level of $2 \times 10^{-6}$ Torr., TPT was vacuum first deposited on the substrate at a rate of 0.1 nm/second to form a 50 nm thick hole transport layer. Then, DCM used as an electroluminescent material was vacuum deposited at a rate of 0.01 nm/second to form a 0.2 nm thick emission layer. Thereafter, Alq used as the electron transport material was further vacuum deposited at a rate of 0.1 nm/second to form a 50 nm thick electron transport layer.

Further, aluminium and lithium were, respectively, vacuum deposited from separate deposition sources to form a 150 nm thick co-deposition layer of Al and Li for use as a cathode. The vacuum deposition operations were continuously performed without breaking the vacuum conditions. The layer thicknesses of the respective layers were monitored by use of a film thickness gauge using a quartz vibrator.

After fabrication of the device, leads were attached to the respective electrodes in dry nitrogen, followed by measurement of characteristic properties. The emission or luminous efficiency was determined as a value when the luminance was at $100\ cd/m^2$. The drive lifetime was defined as a time before the luminance was reduced to $500\ cd/m^2$ when the device was driven at a given current density of $40\ mA.cm^2$ at an initial luminance of $1000\ cd/m^2$.

Similar measurements were made while changing the thicknesses of the emission layer and electron transport layer. The results are shown in Table 1.

TABLE 1

| Thickness of emission layer (nm) | Thickness of electron transport layer (nm) | Peak wavelength (nm) | Luminous efficiency (luminance/W) | Drive life (hours) |
|---|---|---|---|---|
| 0.2 | 49.8 | 591 | 2.5 | 300 |
| 0.5 | 49.5 | 593 | 2.2 | 290 |
| 1 | 49 | 593 | 2.0 | 290 |
| 2 | 48 | 596 | 1.9 | 230 |
| 4 | 46 | 598 | 1.8 | 150 |
| 10 | 40 | 614 | 0.2 | 4 |
| 20 | 30 | 639 | 0.1 | 3 |
| 50 | 0 | 648 | 0.05 | 1 or below |

As will be apparent from the above results, when the thickness of the emission layer is 4 nm or below, the luminous efficiency and the drive time are significantly improved.

It will be noted that the fluorescent lifetime of DCM is 2 to 3 nanoseconds and that of the Alq is about 12 nanoseconds. When the emission layer thickness is 1 nm or below, there is the great possibility that the thin layer is not continuous, but is formed as islands. In this case, good results are obtained.

EXAMPLE 2

This example illustrates the fabrication of an electroluminescent device of the types shown in FIGS. 3 and 4.

The general procedure of Example 1 was repeated except that the emission layer was formed in a thickness of 0.2 nm and the thickness of the electron transport layer including the emission layer was 50 nm and that after formation of the emission layer, the electron transport layer was further formed while changing the distance X in FIG. 3, and/or the hole transport layer was further formed on the emission layer while changing the distance Y in FIG. 4, The results are shown in Table 2 below.

TABLE 2

| Position of emission layer (nm) | Peak wavelength (nm) | Luminous efficiency (lm/W) | Drive Life (hours) |
|---|---|---|---|
| X = 0 | 591 | 2.5 | 300 |
| X = 0.5 | 595 | 1.8 | 280 |
| X = 2 | 598 | 1.6 | 280 |
| X = 5 | 602 | 1.5 | 270 |
| X = 10 | 606 | 1.5 | 250 |
| X = 20 | 610 | 1.3 | 250 |
| X = 40 | 530 | 0.7 | 100 |
| Y = 0.5 | 580 | 2.4 | 310 |
| Y = 2 | 540 | 2.1 | 300 |
| Y = 5 | 530 | 2.0 | 300 |
| X = 0, 5* | 595 | 2.6 | 350 |
| X = 0, 5, 10** | 605 | 2.8 | 400 |

*The emission layer was formed at two positions of 0 and 5 nm distant from the interface with the hole transport layer.
**Likewise, the emission layer was formed at three positions of 0, 5, 10 nm from the interface with the hole transport layer.

From the results of Table 2 above, it will be seen that when the emission layer is formed in the electron transport layer at a distance from the interface of up to X=20 and in the hole transport layer up to Y=2, a good luminous efficiency and drive life are ensured.

When the emission layer is formed in the hole transport layer at Y=2 or over, there could not be obtained electroluminescent emission from DCM, but green electroluminescent emission from the Alq of the electron transport layer was observed. On the other hand, when the emission layer was formed in the electron transport layer, orange electroluminescent emission from DCM was obtained when the emission layer was distant at 20 nm from the interface with the hole transport layer. Moreover, a plurality of the emission layers are formed between the electron transport layer and the hole transport layer, and also in the electron transport layer, the luminous efficiency and the drive life are both significantly improved.

EXAMPLE 3

This example illustrates the fabrication of an electroluminescent device of the type shown in FIG. 5.

The general procedure of Example 1 was repeated except that a hole block and/or an electron block layer was further formed as shown in the figure, and the thicknesses of the emission layer and the electron transport layer were, respectively, those indicated in Example 2.

The hole and electron block layers were, respectively, made of LiF or a triazole derivative (3-(4-biphenylyl)-4-phenylyl-5-t-butylphenylyl-1,2,4-trizole, TAZ) in a manner indicated in Table 3.

The results are shown in Table 3 below.

| Hole block layer (nm) | Electron block layer (nm) | Luminous efficiency (lm/W) | Drive life (hours) |
|---|---|---|---|
| — | — | 2.5 | 300 |
| LiF: 0.5 nm | — | 2.9 | 380 |
| — | LiF: 0.5 nm | 2.7 | 350 |
| LiF: 0.5 nm | LiF: 0.5 nm | 3.2 | 400 |
| TAZ: 5 nm | — | 2.7 | 370 |
| TAZ: 5 nm | TAZ: 5 nm | 2.9 | 390 |

The results of Table 3 reveal that the provision of at least one of the hole block layer and the electron block layer is effective in improving the luminous efficiency and drive life.

EXAMPLE 4

This example illustrates the fabrication of an electroluminescent device of the type shown in FIG. 6.

The general procedure of Example 1 was repeated except that a mixed layer of TPT used as a hole transport material and DCM used as an electroluminescent material at a mixing ratio by mole of 1:1 and/or a mixed layer of Alq used as an electron transport material and DCM at a mixing ratio by mole of 1:1 was, respectively, formed in contact with the emission layer in a manner as shown in the figure in a thickness of 10 nm by vacuum co-deposition and that the thicknesses of the emission layer and the electron transport layer were, respectively, those indicated in Example 2.

The mixed layer containing the hole transport material was provided between the hole transport layer and the emission layer, and the mixed layer containing the electron transport material was provided between the electron transport layer and the emission layer.

The resultant devices were subjected to measurements in the same manner as in Example 1, with the results shown in Table 4 below.

TABLE 4

| Mixed layer of hole transport material and electroluminescent material | Mixed layer of electron transport material and electroluminescent material | Luminous efficiency (lm/W) | Drive life (hours) |
| --- | --- | --- | --- |
| no | no | 2.5 | 300 |
| yes | no | 2.6 | 400 |
| no | yes | 2.5 | 380 |
| yes | yes | 2.7 | 450 |

The above results reveal that the provision of at least one type of mixed layer is very effective in improving the luminous efficiency and drive life.

EXAMPLE 5

The general procedure of Example 1 was repeated except that there were used electroluminescent materials, indicated in Table 5, in place of DCM, and the thickness was at 0.2 nm and the hole transport layer including the emission layer was in a thickness of 50 nm.

The devices were subjected to measurements of characteristic properties, with the results shown in Table 5 below.

TABLE 5

| Emission layer | Peak wavelength (nm) | Luminous efficiency | Drive life (hours) |
| --- | --- | --- | --- |
| DCM | 591 | 2.5 | 300 |
| DMQ | 530 | 5.6 | 700 |
| Coumarin 6 | 510 | 6.5 | 650 |
| Rubrene | 560 | 4.7 | 800 |

The results of the above table reveal that the organic electroluminescent devices using different types of luminescent materials are excellent in the luminous efficiency and drive life.

EXAMPLE 6

This example illustrates the fabrication of devices of the type shown in FIGS. 7 and 8 wherein three emission layers 14a, 14b, 14c were successively formed each in a thickness of 1 nm to form a built-up layer as shown in FIG. 7 and one emission layer 14a was provided between the hole transport layer 12 and the electron transport layer 16 in the thickness as mentioned above and two emission layers 14b, 14c were, respectively, formed in the electron transport layer 16 each in a similar thickness as mentioned above so that the three layers were distant from one anther at a distance of 5 nm as shown in FIG. 8.

When the devices of both types were each subjected to measurement characteristic properties, similar results as in the foregoing examples were obtained.

If a first organic material capable of red electroluminescent emission, a second organic material capable of green electroluminescent emission, and a third organic material capable of blue electroluminescent emission are, respectively, formed as layers 14a, 14b and 14c, white electroluminescent emission can be realized. When this white emission is passed through an appropriate filter system, the white emission can be separated into several different color emissions.

EXAMPLE 7

This example illustrates the fabrication of organic electroluminescent devices wherein an emission layer 14" is patterned in a desired form having a number of regions, and at least two different types of electroluminescent materials are, respectively, formed in the regions so that the materials are alternately formed in the regions.

The general procedure of Example 1 was repeated except that three different organic materials capable of different color electroluminescent emissions were formed in a thickness of 1 nm by vacuum deposition through a mask, thereby forming an emission layer 14" having regions 14'd, 14'e, 14'f of different organic materials in section as shown in FIG. 9.

These regions were in the form of stripes to provide a striped pattern as shown in FIG. 10a and in the form of blocks to provide a check pattern as shown in FIG. 10b.

When the regions 14'd, 14'e, 14'f were, respectively, made of an organic material capable of red electroluminescent emission, an organic material capable of green electroluminescent emission, and an organic material capable of blue electroluminescent emission, white electroluminescent emission was obtained.

If at least two types of organic materials capable of electroluminescently emitting different colors are, respectively, used to form the emission regions therewith alternately, substantially any desired color emission becomes possible.

As will be apparent from the above examples, the devices of the invention have a high luminous efficiency and a small lowering of brightness during the drive life thereof. Moreover, different color emissions can be readily obtained.

What is claimed is:

1. An organic electroluminescent device, which comprises a pair of electrodes, and a layer structure provided between the pair of electrodes and including a charge transport layer capable of transporting electrons of holes and an emission layer comprising a major proportion of an organic material capable of emitting light on application of a voltage thereto via the pair of electrodes, wherein the organic material undergoes concentration quenching and said emission layer has a thickness of 4 nm or below.

2. The organic electroluminescent device according to claim 1, wherein said emission layer consists essentially of the organic material.

3. The organic electroluminescent device according to claim 1, wherein said emission layer is the form of islands.

4. The organic electroluminescent device according to claim 1, wherein said layer structure includes a hole transport layer and an electron transport layer wherein said emission layer is provided between said hole transport layer and said electron transport layer.

5. The organic electroluminescent device according to claim 4, further comprising a hole block layer provided between said emission layer and said electron transport layer.

6. The organic electroluminescent device according to claim 4, further comprising an electron block layer provided between said emission layer and said hole transport layer.

7. The organic electroluminescent device according to claim 4, further comprising a mixed layer of a first organic material present in said emission layer and a second organic material present in said electron transport layer, which mixed layer being provided between said emission layer and said electron transport layer.

8. The organic electroluminescent device according to claim 7, wherein a ratio between said first organic material and said second organic material is in the range of 1:100 to 4:5 on the molar basis.

9. The organic electroluminescent device according to claim 4, further comprising a mixed layer of a first organic material present in said emission layer and a second organic material present in said hole transport layer, which mixed layer being provided between said emission layer and said hole transport layer.

10. The organic electroluminescent device according to claim 7, wherein a ratio between said first organic material and said second organic material is in the range of 1:100 to 4:5 on the molar basis.

11. The organic electroluminescent device according to claim 1, wherein said layer structure includes a hole transport layer and an electron transport layer wherein said emission layer is provided inbetween sub-layers of said hole transport layer.

12. The organic electroluminescent device according to claim 11, wherein said emission layer is distant from an interface between said hole transport layer and the sub-layer of said hole transport layer in contact with said electron transport layer at 2 nm or below.

13. The organic electroluminescent device according to claim 1, wherein said layer structure includes a hole transport layer and an electron transport layer wherein said emission layer is provided inbetween sub-layers of said electron transport layer.

14. The organic electroluminescent device according to claim 13, wherein said emission layer is distant from an interface between the sub-layer of said electron transport layer in contact with said hole transport layer at 20 nm or below.

15. The organic electroluminescent device according to claim 1, wherein said layer structure includes a hole transport layer, an electron transport layer, and a plurality of emission layers formed at a corresponding number of portions including a portion between said hole transport layer and said electron transport layer, a portion between sub-layers of said hole transport layer, said at least one portion between sub-layers of said electron transport layer.

16. The organic electroluminescent device according to claim 1, wherein said emission layer has a multi-layered structure.

17. The organic electroluminescent device according to claim 16, wherein said emission layer has at least two sub-layers, respectively, made of a corresponding number of compounds capable of different color electroluminescent emissions.

18. The organic electroluminescent device according to claim 1, wherein said emission layer is formed in a pattern having a number of emission regions.

19. The organic electroluminescent device according to claim 18, wherein said pattern is a striped pattern.

20. The organic electroluminescent device according to claim 18, wherein said pattern is a block pattern.

21. An organic electroluminescent device, which comprises a pair of electrodes, and a layer structure provided between the pair of electrodes and including a charge transport layer capable of transporting electrons or holes and an emission layer which consists essentially of an organic material capable of emitting light on application of a voltage thereto via the pair of electrodes and is in the form of islands, wherein the organic material has a fluorescent lifetime shorter than that of an organic material present in the charge transport layer.

22. The organic electroluminescent device according to claim 21, wherein said organic material has a fluorescent lifetime shorter than 10 nanoseconds.

23. The organic electroluminescent device according to claim 21, wherein said layer structure includes a hole transport layer, an electron transport layer, and a plurality of emission layers formed at a corresponding number of portions including a portion between said hole transport layer and said electron transport layer, a portion inbetween sub-layers of said hole transport layer, and at least one portion inbetween sub-layers of said electron transport layer.

24. The organic electroluminescent device according to claim 21, wherein said layer structure includes a hole transport layer and an electron transport layer wherein said emission layer is provided between said hole transport layer and said electron transport layer.

25. The organic electroluminescent device according to claim 24, further comprising a hole block layer provided between said emission layer and said electron transport layer.

26. The organic electroluminescent device according to claim 24, further comprising an electron block layer provided between said emission layer and said hole transport layer.

27. The organic electroluminescent device according to claim 24, further comprising a mixed layer of a first organic material present in said emission layer and a second organic material present in said electron transport layer, which mixed layer being provided between said emission layer and said electron transport layer.

28. The organic electroluminescent device according to claim 27, wherein a ratio between said first organic material and said second organic material is in the range of 1:100 to 4:5 on the molar basis.

29. The organic electroluminescent device according to claim 24, further comprising a mixed layer of a first organic material present in said emission layer and a second organic material present in said hole transport layer, which mixed layer being provided between said emission layer and said hole transport layer.

30. The organic electroluminescent device according to claim 29, wherein a ratio between said first organic material and said second organic material is in the range of 1:100 to 4:5 on the molar basis.

31. The organic electroluminescent device according to claim 21, wherein said layer structure includes a hole transport layer and an electron transport layer wherein said emission layer is provided between sub-layers of said hole transport layer.

32. The organic electroluminescent device according to claim 31, wherein said emission layer is distant from an interface between said hole transport layer and the sub-layer of said hole transport layer in contact with said electron transport layer at 2 nm or below.

33. The organic electroluminescent device according to claim 21, wherein said layer structure includes a hole transport layer and an electron transport layer wherein said emission layer is provided between sub-layers of said electron transport layer.

34. The organic electroluminescent device according to claim 33, wherein said emission layer is distant from an interface between the sub-layer of said electron transport layer in contact with said hole transport layer at 20 nm or below.

35. The organic electroluminescent device according to claim 21, wherein said emission layer has a multi-layered structure.

36. The organic electroluminescent device according to claim 35, wherein said emission layer has at least two sub-layers, respectively, made of a corresponding number of compounds capable of different color electroluminescent emissions.

37. The organic electroluminescent device according to claim 21, wherein said emission layer is formed in a pattern having a number of emission regions.

38. The organic electroluminescent device according to claim 37, wherein said pattern is a striped pattern.

39. The organic electroluminescent device according to claim 37, wherein said pattern is a block pattern.

* * * * *

UNITED STATES PATENT AND TRADEMARK OFFICE
CERTIFICATE OF CORRECTION

PATENT NO. : 6,831,406 B1
DATED : December 14, 2004
INVENTOR(S) : Masao Fukuyama et al.

It is certified that error appears in the above-identified patent and that said Letters Patent is hereby corrected as shown below:

Title page,
Item [56], References Cited, OTHER PUBLICATIONS, "Progress in organic multilayer electrolumine devices" reference, change "Electroluminescent Materials, Devcies, and Large-Screen Displays" to -- Electroluminescent Materials, Devices, and Large-Screen Displays --; "Effect of well number on organic multiple-quantum-well electroluminescent device characteristics" reference, "Effect of well number on organic multiple-quantum-well electroluminescent device characteristics"
to -- Effect of well number on organic multiple-quantum-well electroluminescent device characteristics --;

Column 14,
Line 56, change "transport layer capable of transporting electrons of holes" to
-- transport layer capable of transporting electrons or holes --.

Signed and Sealed this

Fifth Day of July, 2005

JON W. DUDAS
*Director of the United States Patent and Trademark Office*